US010302778B2

(12) United States Patent
O'Neill et al.

(10) Patent No.: US 10,302,778 B2
(45) Date of Patent: *May 28, 2019

(54) SEMICONDUCTOR PHOTOMULTIPLIER WITH BASELINE RESTORATION FOR A FAST TERMINAL SIGNAL OUTPUT INCLUDING OUTPUT LOADS TO CORRECT AN OVERSHOOT OF AN OUTPUT SIGNAL

(71) Applicant: SensL Technologies Ltd., County Cork (IE)

(72) Inventors: Kevin O'Neill, Blackrock (IE); Liam Wall, Glounthaune. Co. Cork (IE); John Carlton Jackson, Cobh (IE)

(73) Assignee: SENSL TECHNOLOGIES LTD., County Cork (IE)

( * ) Notice: Subject to any disclaimer, the term of this patent is extended or adjusted under 35 U.S.C. 154(b) by 0 days.

This patent is subject to a terminal disclaimer.

(21) Appl. No.: 15/935,520

(22) Filed: Mar. 26, 2018

(65) Prior Publication Data

US 2018/0217278 A1     Aug. 2, 2018

Related U.S. Application Data

(63) Continuation of application No. 15/048,547, filed on Feb. 19, 2016, now Pat. No. 9,939,536.

(51) Int. Cl.
*G01T 1/24* (2006.01)
*H01L 27/144* (2006.01)
(Continued)

(52) U.S. Cl.
CPC .............. *G01T 1/248* (2013.01); *G01T 1/208* (2013.01); *G01T 1/2018* (2013.01); *G01T 1/247* (2013.01);
(Continued)

(58) Field of Classification Search
CPC . H01L 31/107; H01L 28/20; H01L 27/14636; H01L 27/14643; H01L 27/1446;
(Continued)

(56) References Cited

U.S. PATENT DOCUMENTS 7,652,257 B2   1/2010  Li et al.
7,714,292 B2   5/2010  Agarwal et al.
(Continued)

FOREIGN PATENT DOCUMENTS

| DE | 102007024074 A1 | 11/2008 |
| GB | 2451678 A | 2/2009 |
| JP | 2008287165 A | 11/2008 |

*Primary Examiner* — Que Tan Le
(74) *Attorney, Agent, or Firm* — Polansky & Associates, P.L.L.C.

(57) ABSTRACT

A semiconductor photomultiplier (SPM) device is described. The SPM comprises a plurality of photosensitive elements, a first electrode arranged to provide a bias voltage to the photosensitive elements, a second electrode arranged as a biasing electrode for the photosensitive elements, a plurality of quench resistive elements each associated with a corresponding photosensitive element, a plurality of output loads; a first node of each output load is common to one of the photosensitive elements and the corresponding quench element; and a third electrode provides an output signal from the photosensitive elements; the third electrode is coupled to a second node of the respective output loads; the outputs loads fully or partially correct an overshoot of the output signal on the third electrode.

37 Claims, 17 Drawing Sheets

(51) Int. Cl.
 *H01L 49/02* (2006.01)
 *G01T 3/08* (2006.01)
 *G01T 1/20* (2006.01)
 *G01T 1/208* (2006.01)

(52) U.S. Cl.
 CPC ............ *G01T 3/08* (2013.01); *H01L 27/1443* (2013.01); *H01L 28/20* (2013.01)

(58) Field of Classification Search
 CPC ........... H01L 31/02027; H01L 21/3205; G01T 1/208; G01T 1/2018; G01T 1/248; G01J 1/4228
 USPC .......................................... 250/207, 214 VT
 See application file for complete search history.

(56) References Cited

U.S. PATENT DOCUMENTS

| | | | |
|---|---|---|---|
| 7,897,906 B2 * | 3/2011 | Deschamps | ........ H03K 17/0416 250/214 R |
| 8,003,948 B2 | 8/2011 | Haselman et al. | |
| 9,810,795 B2 | 11/2017 | Jackson et al. | |
| 2004/0245592 A1 | 12/2004 | Harmon et al. | |
| 2008/0203309 A1 | 8/2008 | Frach et al. | |
| 2010/0102242 A1 | 4/2010 | Burr et al. | |
| 2010/0108900 A1 | 5/2010 | Burr et al. | |
| 2010/0214654 A1 | 8/2010 | Birk et al. | |
| 2011/0108711 A1 | 5/2011 | Tsupryk et al. | |
| 2011/0248175 A1 | 10/2011 | Frach et al. | |
| 2011/0315856 A1 | 12/2011 | O'mathuna et al. | |

* cited by examiner

SEMICONDUCTOR PHOTOMULTIPLIER WITH BASELINE RESTORATION FOR A FAST TERMINAL SIGNAL OUTPUT INCLUDING OUTPUT LOADS TO CORRECT AN OVERSHOOT OF AN OUTPUT SIGNAL

RELATED APPLICATIONS

The present is a Continuation application of U.S. patent application Ser. No. 15/048,547, filed on 19 Feb. 2016, the entirety of which is incorporated herein by reference.

FIELD OF THE INVENTION

The present teaching relates to photon detectors. In particular, the present teaching relates to fast, high sensitivity photon detectors such as semiconductor photomultipliers, and to a readout method for semiconductor photomultipliers. In particular, but not exclusively, the present teaching relates to semiconductor photomultipliers (SiPMs or SPMs) in such areas as Positron Emission Tomography [PET], including Time-Of-Flight PET [TOF-PET], Laser Ranging [LIDAR] applications, bio luminescence, High Energy Physics [HEP] detectors.

BACKGROUND

SPMs are semiconductor photon sensitive devices made up of an array of very small Geiger-mode avalanche photodiode (APD) cells on a substrate such as silicon. An example 10×10 microcell array is shown in FIG. 1 of the accompanying drawings. Each cell is connected to one another to form one larger device with one signal output. The entire device size may be as small as 1×1 mm or much larger. FIG. 2 of the accompanying drawings is a schematic diagram of a conventional silicon photomultiplier.

APD cells vary in dimension from 20 to 100 microns depending on the mask used, and can have a density of up to 1000/sq. mm. Avalanche diodes can also be made from other semiconductors besides silicon, depending on the properties that are desirable. Silicon detects in the visible and near infrared range, with low multiplication noise (excess noise). Germanium (Ge) detects infrared to 1.7 μm wavelength, but has high multiplication noise. InGaAs (Indium Gallium Arsenide) detects to a maximum wavelength of 1.6 μm, and has less multiplication noise than Ge. InGaAs is generally used for the multiplication region of a heterostructure diode, is compatible with high speed telecommunications using optical fibres, and can reach speeds of greater than Gbit/s. Gallium nitride operates with UV light. HgCdTe (Mercury Cadmium Telluride) operates in the infrared, to a maximum wavelength of about 14 μm, requires cooling to reduce dark currents, and can achieve a very low level of excess noise.

Silicon avalanche diodes can function with breakdown voltages of 100 to 2000V, typically. APDs exhibit internal current gain effect of about 100-1000 due to impact ionization, or avalanche effect, when a high reverse bias voltage is applied (approximately 100-200 V in silicon). Greater voltage can be applied to silicon APDs, which are more sensitive compared to other semiconductor photodiodes, than to traditional APDs before achieving breakdown allowing for a larger operating gain, preferably over 1000, because silicon APDs provide for alternative doping. Reverse voltage is proportional to gain, and APD gain also varies dependently on both reverse bias and temperature, which is why reverse voltage should be controlled in order to preserve stable gain.

SPMs can achieve a gain of $10^5$ to $10^6$ by using Geiger mode APDs which operate with a reverse voltage that is greater than the breakdown voltage, and by maintaining the dark count event rate at a sufficiently low level.

Geiger-mode APDs produce relatively large charge pulse when struck by a photon of the same amplitude no matter the energy of the photon. When reading out conventional APDs, noise of the preamplifier significantly degrades timing and amplitude resolution performance for short (shorter than approximately 500 ns) light pulses. Compared to conventional APDs, SPMs using Geiger mode APDs provide much higher output amplitude, essentially eliminating the impact of preamplifier noise.

Many SPM [Silicon Photomultiplier] applications call for a fast light-to-current response, with order of 1 ns or even shorter time constants. Improved time response would benefit such applications as time-resolved spectroscopy, LIDARs, TOF [time of flight] PET [Positron Emission Tomography] etc.

At the moment use of the SPM for 'fast' applications, especially large area SPMs is seriously compromised by the fact that the bulk of the SPM's signal charge is released as an exponentially decaying current with a long ~50 ns time constant. However, the avalanche development process in the SPM APD is extremely fast and the long time constant arises due to the fact that the APD signals are read out through the distributed SPM's biasing circuitry.

It is desirable to provide new electrode detector configurations to enhance currently known Silicon Photomultiplier [SiPM], also known as SPM, MicroPixel Photon Counters [MPPC], MicroPixel Avalanche Photodiodes [MAPD] with improved performance in such areas as Positron Emission Tomography [PET], including Time-Of-Flight PET [TOF-PET], Laser Ranging [LIDAR] applications, bio luminescence, High Energy Physics [HEP] detectors.

Currently known Silicon Photomultipliers provide minimum output rise time in the order of 1 nS and fall time of at least 10 ns. This is much longer than conventional vacuum Photomultiplier (PMTs) or silicon avalanche photodiodes (APDs) resulting in performance loss and complication of readout electronics. SPMs in attempt to address this problem have been designed to include a fast terminal readout terminal. However, due to the fast terminal's AC coupled nature, the output includes an undesirable overshoot during microcell recovery.

There is therefore a need to provide a semiconductor photomultiplier which addresses at least some of the drawbacks of the prior art.

SUMMARY

The present disclosure relates to a semiconductor photomultiplier device comprising: a plurality of photosensitive elements, a first electrode arranged to provide a bias voltage to the photosensitive elements, a second electrode arranged as a biasing electrode for the photosensitive elements, a plurality of quench resistive elements each associated with a corresponding photosensitive element, a plurality of output loads each having a capacitive load operably coupled to a resistive load in a parallel configuration between first and second nodes; each first node is common to one of the photosensitive elements and the corresponding quench resistive element; and a third electrode coupled to the second nodes of the output loads to provide an output signal from the photosensitive elements; wherein the output loads fully or partially correct an overshoot of an output signal on the third electrode.

In one aspect, the output signal on the third electrode is a positive signal with no negative overshoot.

In another aspect, the output signal on the third electrode is proportional to number of photons detected.

In a further aspect, each resistive load comprises a resistor.

In an exemplary aspect, each resistive load comprises a MOS transistor arranged in a resistor configuration. In one example, each capacitive load is provided by parasisitc capacitance between the gate and drain of the MOS transistor.

In one aspect, the output loads fully or partially correct a negative overshoot of the output signal on the third electrode.

In one aspect, the photosensitive elements are formed in active regions on a substrate.

In another aspect, the quench resistive elements and the resisitive loads are formed on a single polysilicon layer which is patterned.

In a further aspect, the polysilicon layer has first regions of a first resistivity level and second regions of a second resistivity level.

In an exemplary aspect, the first resistivity level is higher than the second resistivity level. Advantageously, the quench resistive elements are formed in the second regions and the resistive loads are formed in the first regions.

In one aspect, each photosensitive element comprises a single photon avalanche diode (SPAD). Advantageously, the SPAD is a Geiger mode avalanche photodiode.

In a further aspect, the third electrode is configured such that the signal path from each photosensitive element are approximately equal in order to minimize time delay variations.

In one aspect, the signal path from each photosensitive element is configured to reduce signal time delay variations.

The present disclosure also relates to a detector comprising: a plurality of photosensitive elements, a first electrode arranged to provide a bias voltage to the photosensitive elements, a second electrode arranged as a biasing electrode for the photosensitive elements, a plurality of quench resistive elements each associated with a corresponding photosensitive element, a plurality of output loads each having a capacitive load operably coupled to a resistive load in a parallel configuration between first and second nodes; each first node is common to one of the photosensitive elements and the corresponding quench element; a third electrode coupled to the second nodes of the output loads to provide an output signal from the photosensitive elements; and a readout circuit operable for communicating with the third electrode.

In one aspect, the readout circuit comprises a transformer for impedance matching the third electrode with a 50 ohm waveguide. Advantageously, the transformer is a Ruthroff transformer. In one example, the waveguide is a coaxial cable.

In another aspect, readout signals from the readout circuit are used for discriminating between neutron and gamma events.

The present disclosure also relates to a method of fabricating a photomultiplier as claimed in claim 1; the method comprising: providing a plurality of photosensitive elements on a substrate, providing a first electrode on the substrate which is arranged to provide a bias voltage to the photosensitive elements, providing a second electrode on the substrate which is arranged as a biasing electrode for the photosensitive elements, providing a plurality of quench resistive elements on the substrate such that each quench resistive element is associated with a corresponding photosensitive element, providing a plurality of output loads on the substrate whereby each output load has a capacitive load operably coupled to a resistive load in a parallel configuration between first and second nodes; each first node is common to one of the photosensitive elements and the corresponding quench element; and providing a third electrode on the substrate which is coupled to the second nodes of the output loads to provide an output signal from the photosensitive elements.

In one aspect of the method, the photosensitive elements are formed in active regions on the substrate.

In another aspect of the method, the quench resistive elements and the resisitive loads are formed by patterning a single polysilicon layer.

In a further aspect of the method, the polysilicon layer has first regions of a first resistivity level and second regions of a second resistivity level.

In another aspect of the method, the first resistivity level is higher than the second resistivity level.

In a further aspect of the method, the quench resistive elements are formed in the second regions and the resistive loads are formed in the first regions.

In an exemplary aspect of the method, the first regions receive two separate ion implant dosages while the second regions receive a single ion implant dosage.

The present disclosure also relates to a method of discriminating between neutron and gamma event; the method comprising generating an output signal on the third electrode of the photomultipier in response to gamma photons or neutrons penetrating a scintillating crystal.

In one aspect, a detection scheme is used to discriminate gamma and neutron events using a detectors operable to accurately reproduce excitation decay.

In another aspect, pulse shapes are reconstructed at time scales shorter than the recovery time for Pulse Shape Discrimination.

In one aspect, wherein a figure of merit (FOM) is used as a criteria for discriminating between neutron and gamma events.

The present disclosure also relates to a method of discriminating between neutron and gamma scintillations events; the method comprising generating an output signal on the third electrode of the photomultipier in response to gamma photons or neutrons penetrating a scintillating crystal.

In one aspect, a detection scheme is used to discriminate gamma and neutron events using a detector operable to accurately reproduce excitation decay.

In another aspect, wherein pulse shapes are reconstructed at time scales shorter than the recovery time for Pulse Shape Discrimination; the output of the third electrode reproduces desirable characteristics of the signal from a traditional photomultiplier, which includes short rise time, short decay time, high signal-to-noise (low Noise Equivalent Power), high frequency, and low output capacitance.

In one aspect, a pulse shape discrimination figure of merit (FOM) is used as a criteria for discriminating between neutron and gamma events; FOM uses two or more integration windows placed at different parts of the electrical signal response which are then used to construct a value that allows discrimination between neutron and gamma events.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

Figure 1:
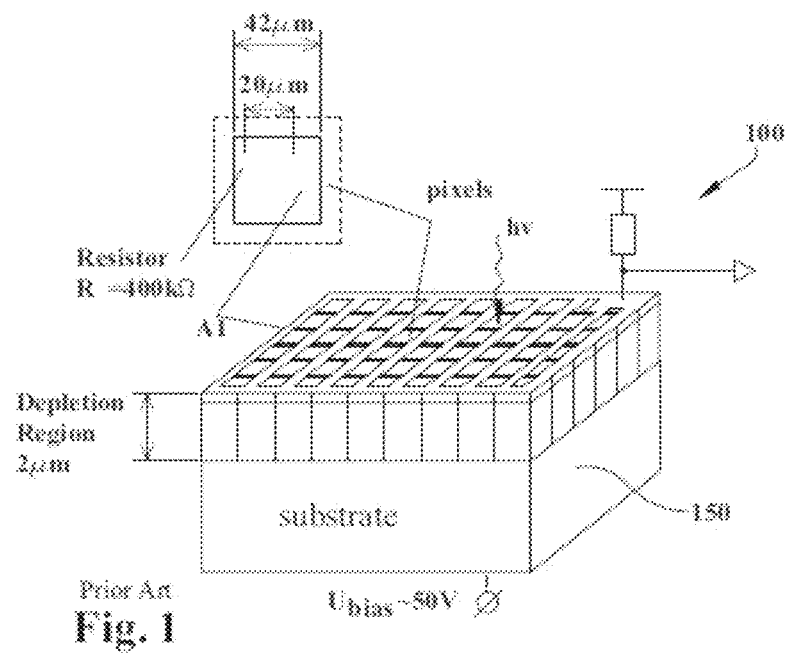
FIG. 1 illustrates the structure of an exemplary silicon photomultiplier.

The present teaching will now be described with reference to some exemplary semiconductor photomultipliers. It will be understood that the exemplary semiconductor photomultipliers are provided to assist in an understanding of the teaching and are not to be construed as limiting in any fashion. Furthermore, circuit elements or components that are described with reference to any one Figure may be interchanged with those of other Figures or other equivalent circuit elements without departing from the spirit of the present teaching. It will be appreciated that for simplicity and clarity of illustration, where considered appropriate, reference numerals may be repeated among the figures to indicate corresponding or analogous elements.

Referring initially to FIG. 1, a silicon photomultiplier 100 comprising an array of Geiger mode photodiodes is shown. The array is formed on a semiconductor substrate 150 using semiconductor processes which will be known to one skilled in the art. Patterned layers of conducting material, insulating material and doped areas of semiconductor form the structure of the photodiode. As illustrated, a quench resistor is provided adjacent to each photodiode which may be used to limit the avalanche current. The photodiodes are electrically connected to common biasing and ground electrodes by aluminium tracking.

Figure 2:
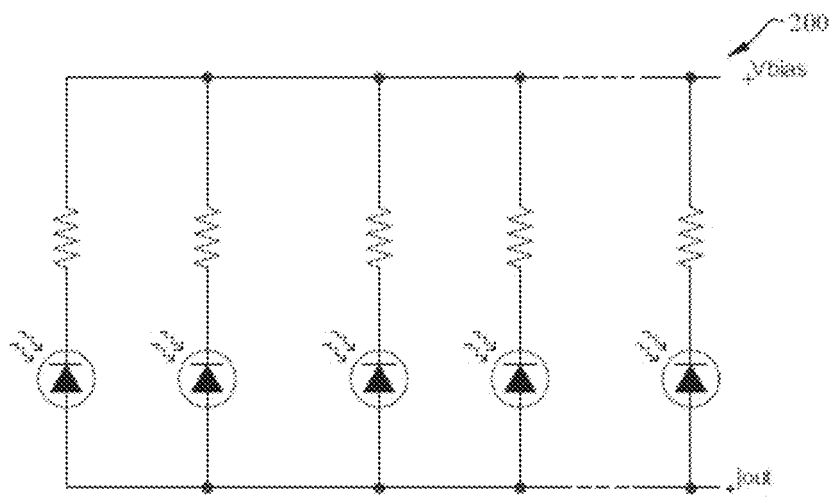
FIG. 2 is a schematic diagram of a prior art silicon photomultiplier.

An equivalent circuit schematic is shown in FIG. 2 for a conventional silicon photomultiplier 200 in which the anodes of an array of photodiodes are connected to a common ground electrode and the cathodes of the array are connected via current limiting resistors to a common bias electrode for applying a bias voltage across the diodes.

Figure 3:
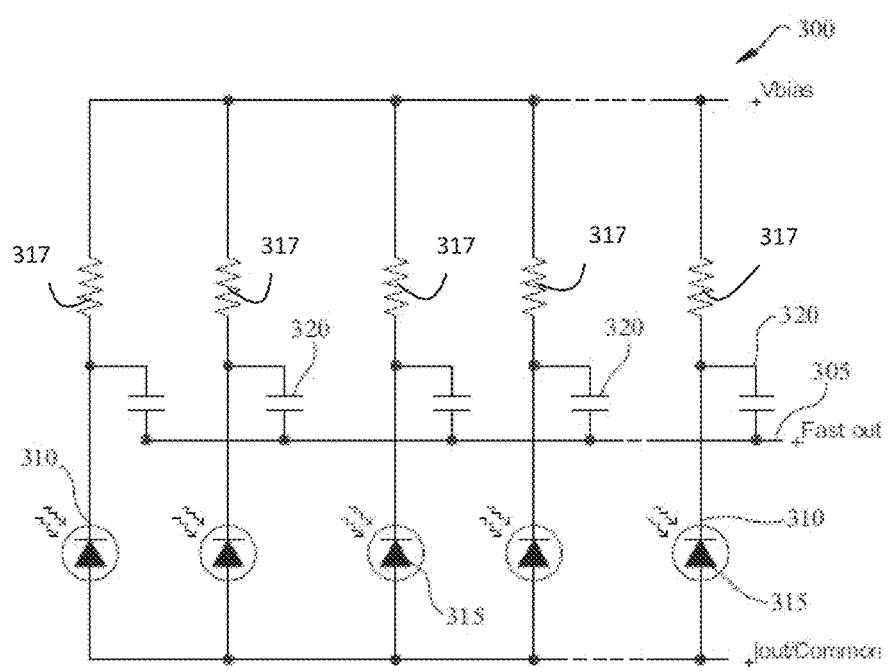
FIG. 3 is a circuit schematic diagram of another prior art silicon photomultiplier with a three electrode connection scheme.

Referring now to FIG. 3 which illustrates a silicon photomultiplier 300 described in PCT Patent Application no. WO 2011/117309 of which the present assignee is the applicant, the contents of which are incorporated herein by reference. The SPM 300 has a third electrode 305 which is capacitively coupled to each photodiode cathode 310 in order to provide a fast readout of the avalanche signals from the photodiodes 315. A quench resistor 317 is associated with each photodiode 315. When the photodiode 315 emits a current pulse, part of the resulting change in voltage at the cathode 310 will be coupled via mutual capacitance 320 into the third electrode 305. Using the third electrode 305 for readout avoids the compromised transient performance resulting from the relatively large RC time constant associated with the biasing circuit. Due to its AC coupled nature, the fast terminal 305 output includes an undesirable negative overshoot during microcell recovery, which results in a non-trivial subtractive signal when many microcell signals are summed over time-scales longer than a characteristic fast terminal pulse width (typically around 1 ns). This makes the fast terminal 305 of the SPM 300 less suitable for high performance energy resolution applications where light signal recovery is important, for example, gamma versus neutron resolution in nuclear detection, and signal recovery from background in LiDAR.

Figure 4:
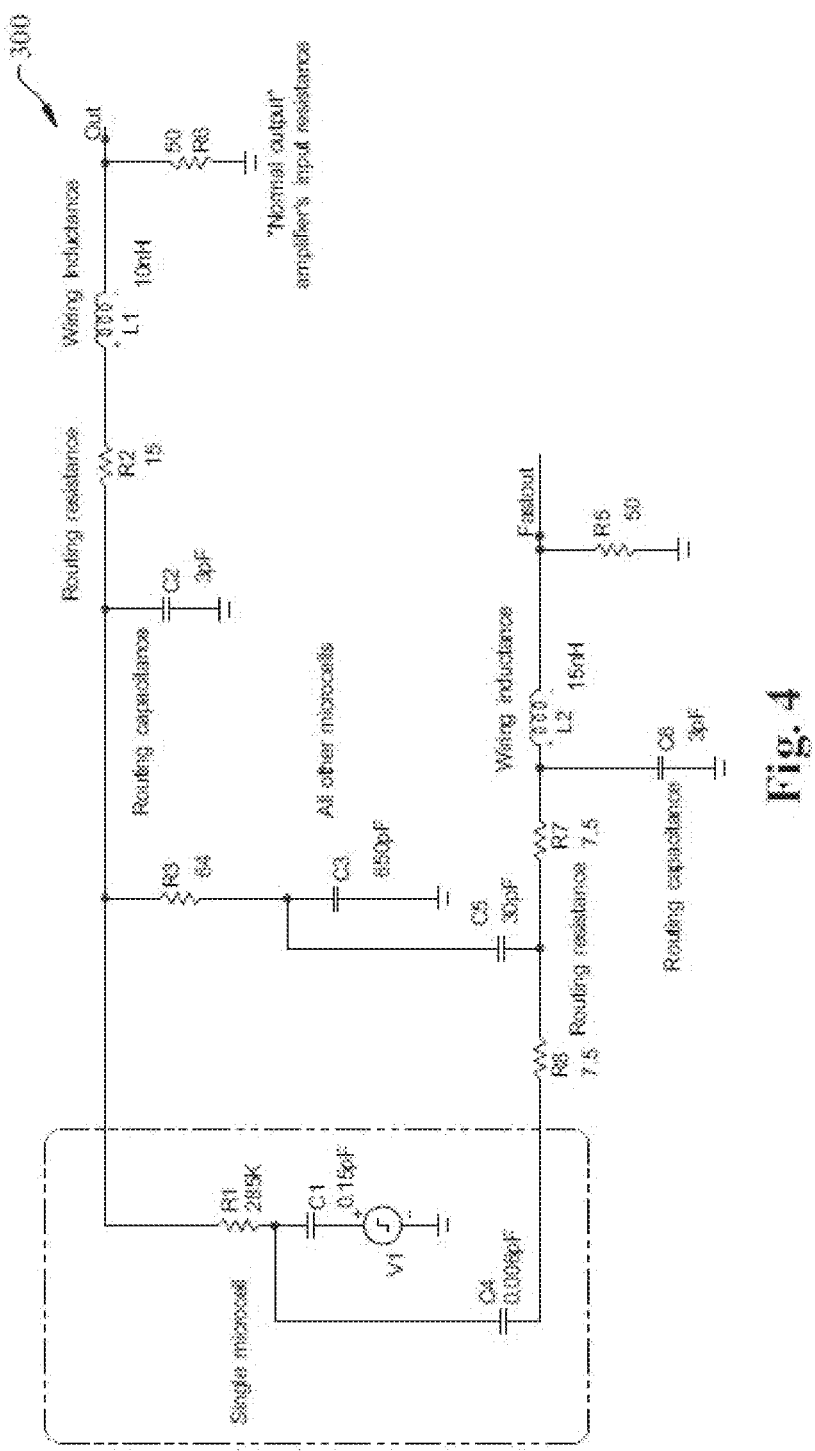
FIG. 4 is an equivalent circuit representation of the silicon photomultiplier of FIG. 3.

FIG. 4 shows an equivalent circuit of SPM 300, the voltage source V1 represents the avalanche voltage of the firing diode, C1 the capacitance of the photodiode 315 and C4 the coupling capacitance 320 between the third electrode 305 and the photodiode 315. The remaining network represents a previously considered biasing circuit and readout approach. In a previously-considered readout the voltage across R6 provides the readout, while the voltage across R5 provides the readout in the SPM 300 of FIG. 4.

Figure 5:
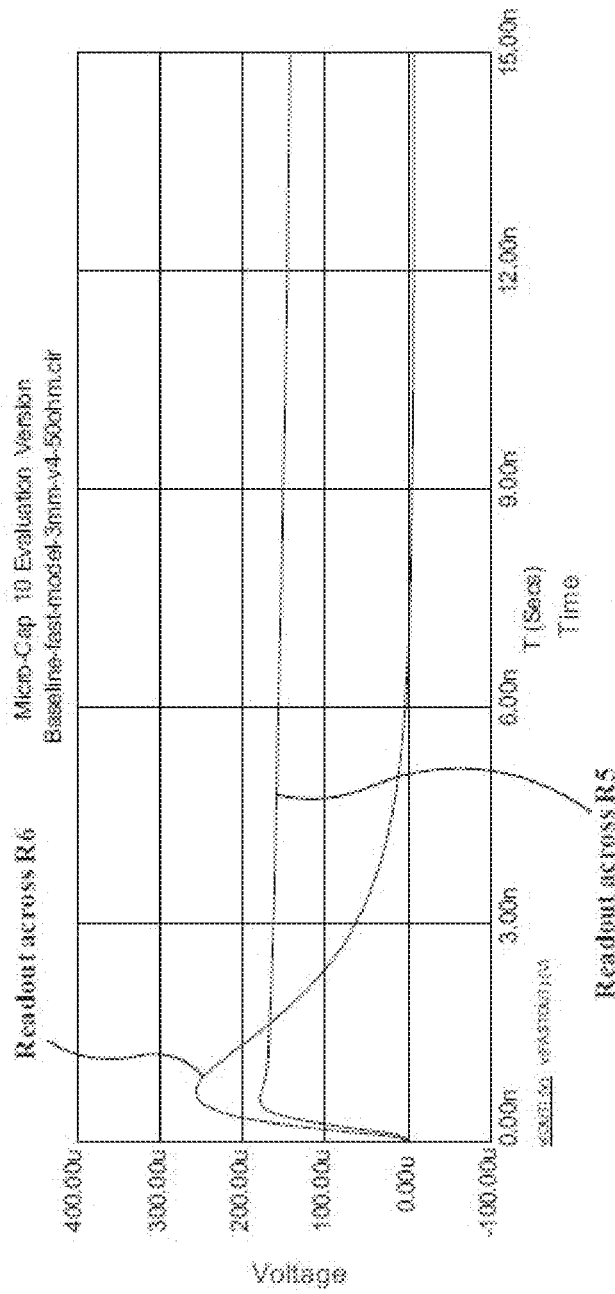
FIG. 5 provides a graphical representation of simulation results using the circuit of FIG. 4.

FIG. 5 shows the results of a simulation using the equivalent circuit of FIG. 4 which compares the rise and fall times of the voltages across R6 and R5 resulting from the injection of a transient avalanche voltage at V1. The voltage across R5 (output of SPM 300) responds more quickly in both rise and fall than the voltage across R6 (output of SPM 200). Semiconductor photomultpliers with fast output known heretofore have several factors limiting their timing performance. These limiting factors include but are not limited to high capacitance of the fast output electrode, series resistance of the fast output electrode, unequal time delay across the device. The limiting factors deteriorate the rise time of the avalanche signal and limit the performance of the silicon photomultiplier in precise timing applications such as Time-Of-Flight Positron Emission Tomography.

Figures 6A, 6B:
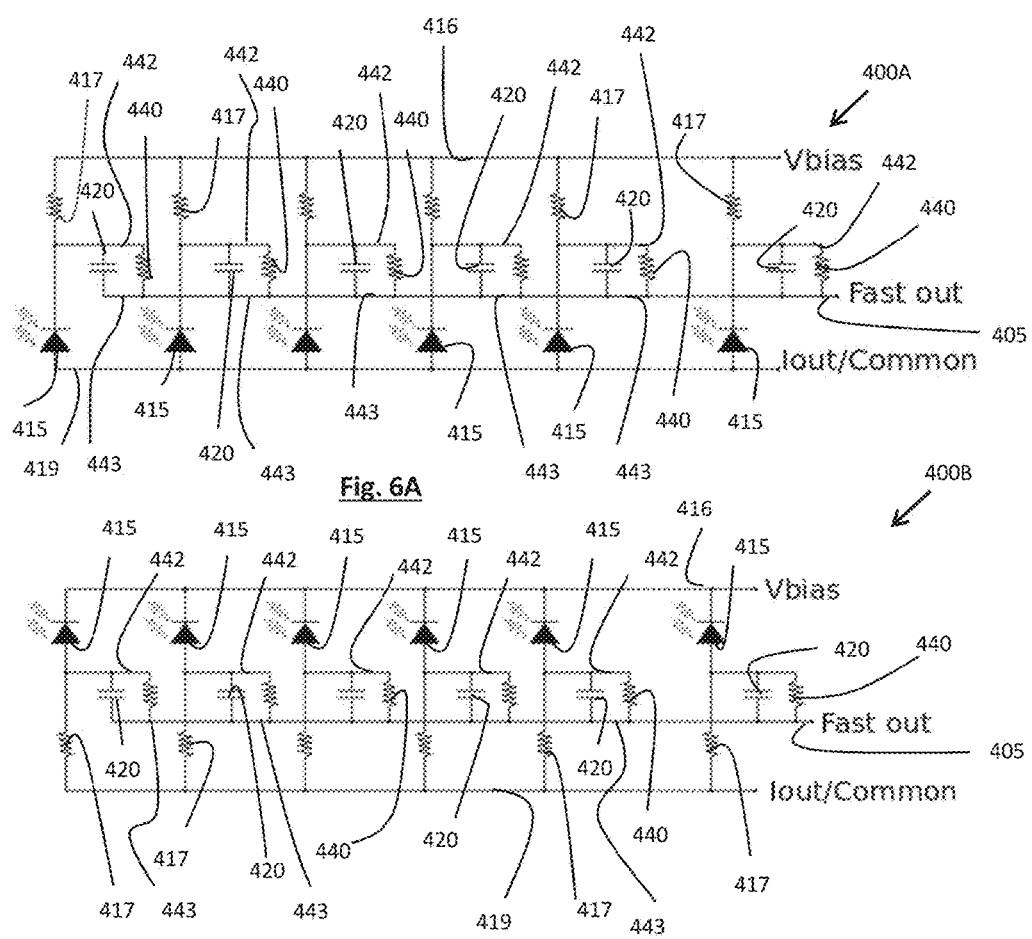
FIG. 6A is a schematic circuit diagram of an SPM device in accordance with the present teaching.
FIG. 6B is a schematic circuit diagram of an SPM device in accordance with the present teaching.

Referring now to FIG. 6A which illustrates a semiconductor photomultiplier 400A in accordance with present teaching. The SPM 400A is designed to fully or partially correct an overshoot on the output response signal. The SPM 400A comprises a plurality of photosensitive elements which in the exemplary embodiment are provided by avalanche diodes 415. A first electrode 416 is arranged to provide a bias voltage Vbias to the diodes 415. A second electrode 419 is arranged as a biasing electrode to provide a reference voltage such as ground. A plurality of quench resistive elements 417 are provided such that each quench resistive element 417 is associated with a corresponding diode 415. A plurality of output loads each having a capacitive load 420 operably coupled to a resistive load 440 in a parallel configuration are provided between a first node 442 and a second node 443. Each first node 442 is common to one of the diodes 415 and the corresponding quench element 417. A third electrode 405 is coupled to the second nodes 443 of the output loads to provide an output signal from the didoes 415. The outputs loads fully or partially correct a negative overshoot of an output signal on the third electrode 405. The third electrode 405 is capacitively coupled to each photodiode 415 in order to provide a fast readout of the avalanche signals from the photodiodes 415. The diodes 415 may be Geiger mode single photon avalanche diode (SPAD) for example. When the photodiode 415 emits a current pulse, part of the resulting change in voltage at the cathode of the photodiode 415 will be coupled via mutual capacitance 420 into the third electrode 405. The SPM 400A includes a design enhancement compared to SPM 300 by including outputs loads which fully or partially correct an overshoot of the output signal on the third electrode 405 which provides the fast output terminal for the SPM 400A. The resistance of the resistive loads 440 may be selected in order to avoid negative or positive overshoots being formed on the outsignal of the third electrode 405. In particular, it is desireable to fully or partially correct overshoot on the output response signal.

In an exemplary arrangement, the resistive loads 440 have a selected resistance in order to eliminate a negative overshoot signal of the output response, thereby ensuring a purely additive signal on the third electrode 405. The third electrode 405 provides a fast output terminal for the SPM400A. The optimal size of the resistive load 440 has a relationship to the diode capacitance, the fast terminal branching capacitance and the quench resistance. In some scintillator readout applications of the known SPMs with fast output it is required to extract energy signal (integral charge) from the fast output terminal. The motivation for that is to reduce number of interconnections and electronics channel. However, the signal present at the fast output terminal is AC coupled with the time constant equal to the quench time. If such time constant is shorter or comparable with the characteristic scintillation time the output signal is distorted (differentiated) resulting in so-called undershoot. The present inventors have realised that is advantageous to increase the quench time constant for the purpose of improving the waveform on the fast output electrode 405 of the SPM 400A. When operating with scintillators especially slow scintillators like Bismuth Germanate (tau=300 ns) the fast output waveform is heavily differentiated as a result of AC coupling with the time constant corresponding to the fast terminal (typically 40 ns). Such differentiation creates difficulties for reconstruction of the event energy through the fast output terminal. The quench time constant may be increased to e.g. 1 uSec (value much bigger than tau) thus practically eliminating such distortions. At the same time the quench time is required to be as small as possible, this allows good rise time of the scintillations signal.

FIG. 6B illustrates another SPM 400B which is also in accordance with present teaching. The SPM 400B is substantially similar to the SPM 400A except the cathodes of the diodes 415 are coupled to the positive biasing electrode 416 instead of the ground biasing terminal 419. Otherwise the operation of SPM 400B is similar to that of SPM 400A.

Figure 6C:
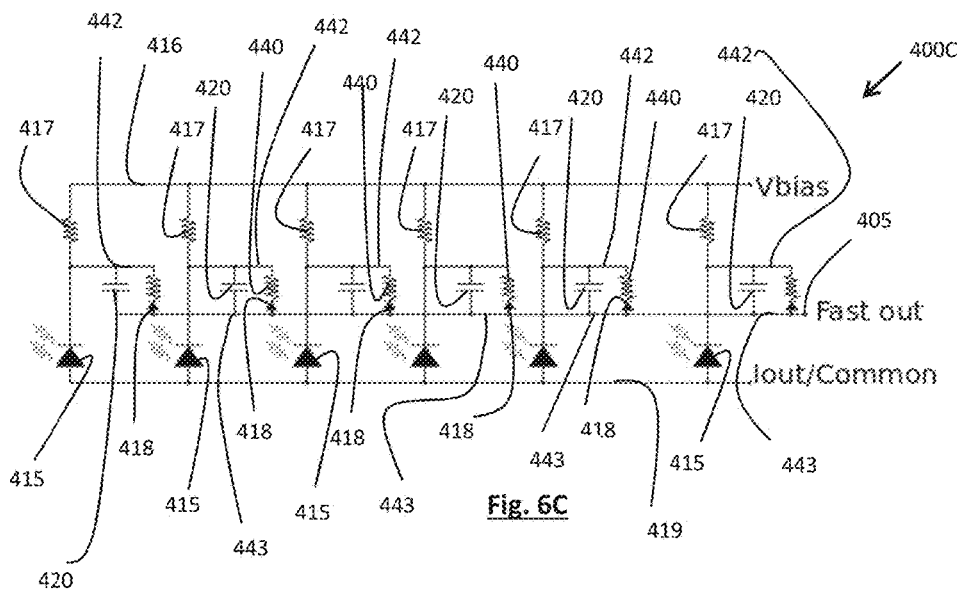
FIG. 6C is a schematic circuit diagram of an SPM device in accordance with the present teaching.

FIG. 6C illustrates another SPM 400C which is also in accordance with present teaching. The SPM 400C is substantially similar to the SPM 400A except each output loads includes a diode 418 in series with the resistive loads 440. The diodes 418 control the flow of current in one direction only in order to reduce the overshoot on the third electrode 405. Otherwise the operation of SPM 400C is similar to SPM 400A.

Figure 6D:
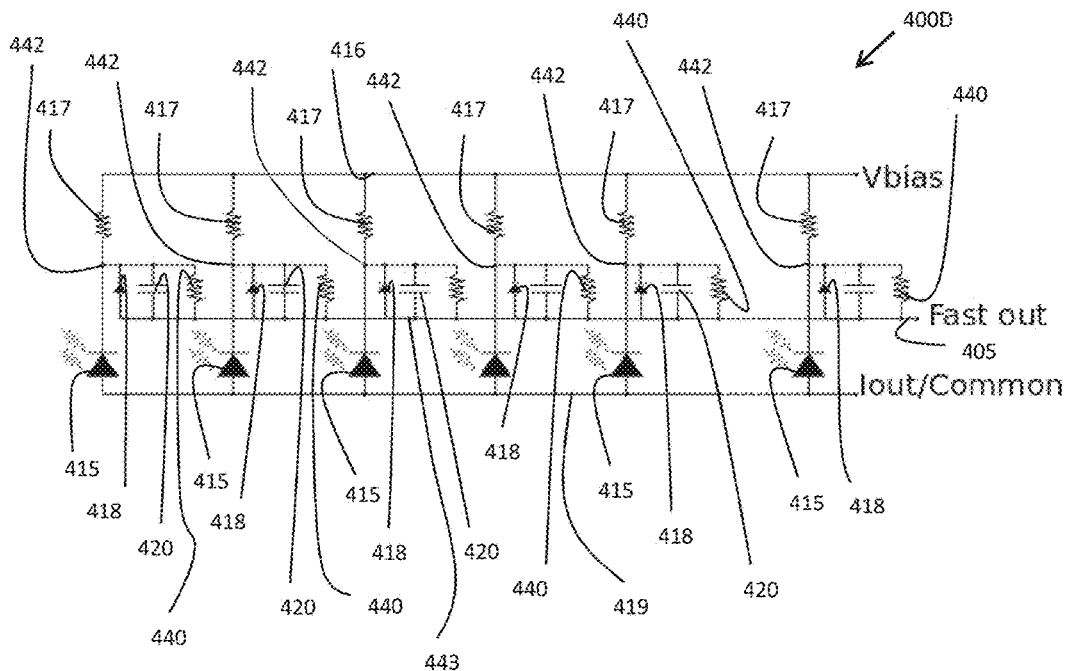
FIG. 6D is a schematic circuit diagram of an SPM device in accordance with the present teaching.

FIG. 6D illustrates another SPM 400D which is also in accordance with present teaching. The SPM 400D is substantially similar to the SPM 400C except the diodes 418 are provided in parallel with the resistive loads 440. The diodes 418 control the flow of current in one direction only in order to reduce the overshoot on the third electrode 405. Otherwise the operation of SPM 400D is similar to SPM 400C.

Figure 6E:
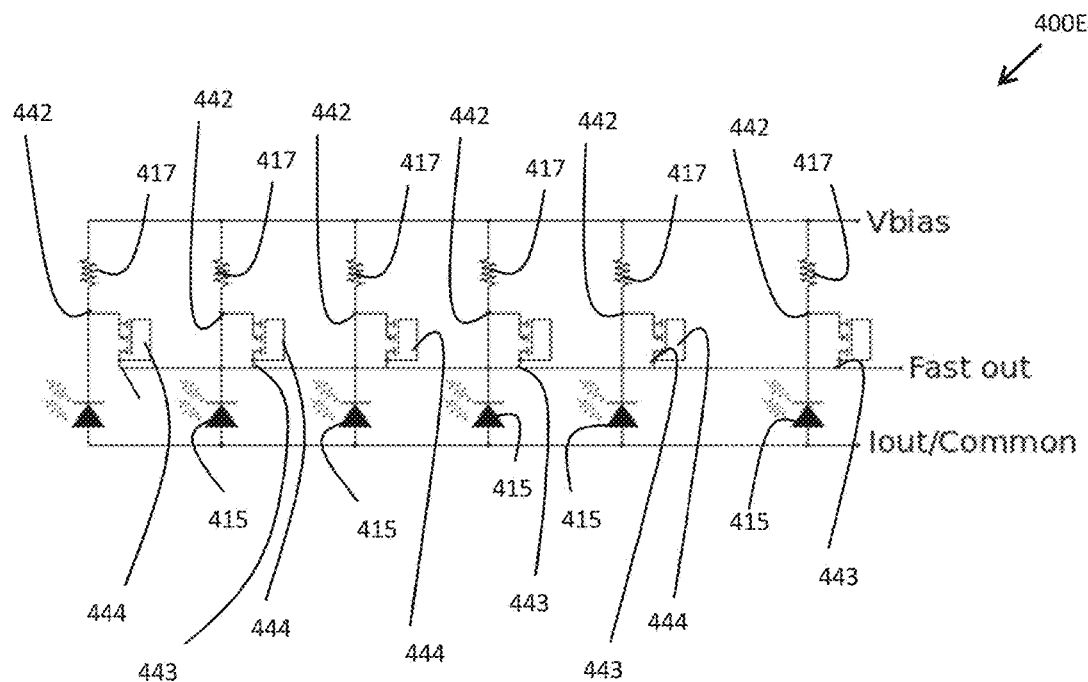
FIG. 6E is a schematic circuit diagram of an SPM device in accordance with the present teaching.

FIG. 6E illustrates another SPM 400D which is also in accordance with present teaching. The SPM 400E is substantially similar to the SPM 400A except the output loads are provided by MOS transistors 444 in a resistor configuration. The resistor configuration provides the resistive loads 440 while the capacitive loads 420 are provided by the gate-drain capacitances of the MOS transistors. Otherwise the operation of the SPM 400E is similar to SPM 400A.

Figure 7:
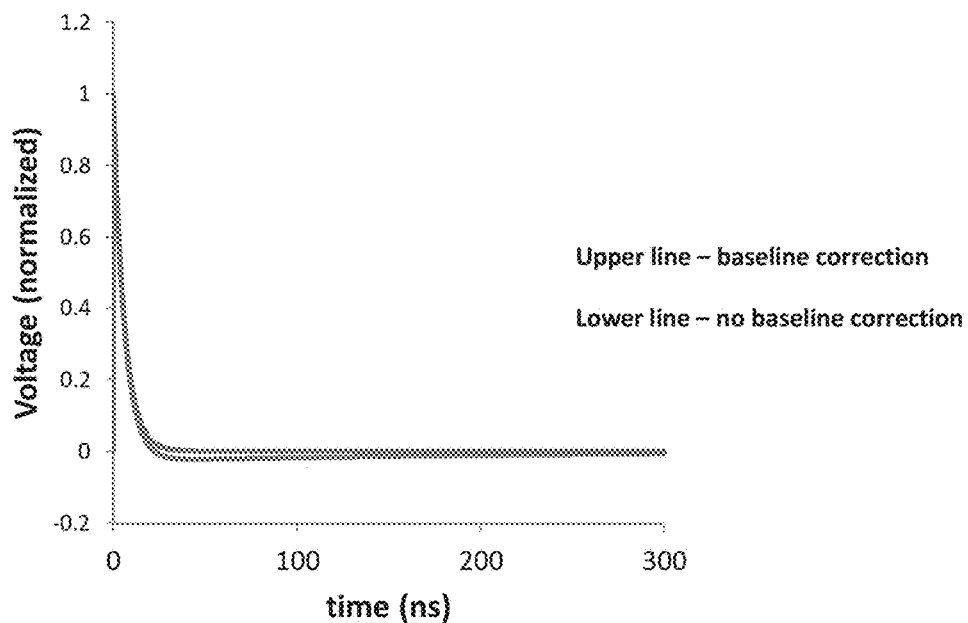
FIG. 7 is a simulated plot showing a comparison of output signals at a third electrode (fast terminal) of an SPM with and without a baseline correcting resistor.
Figure 8:
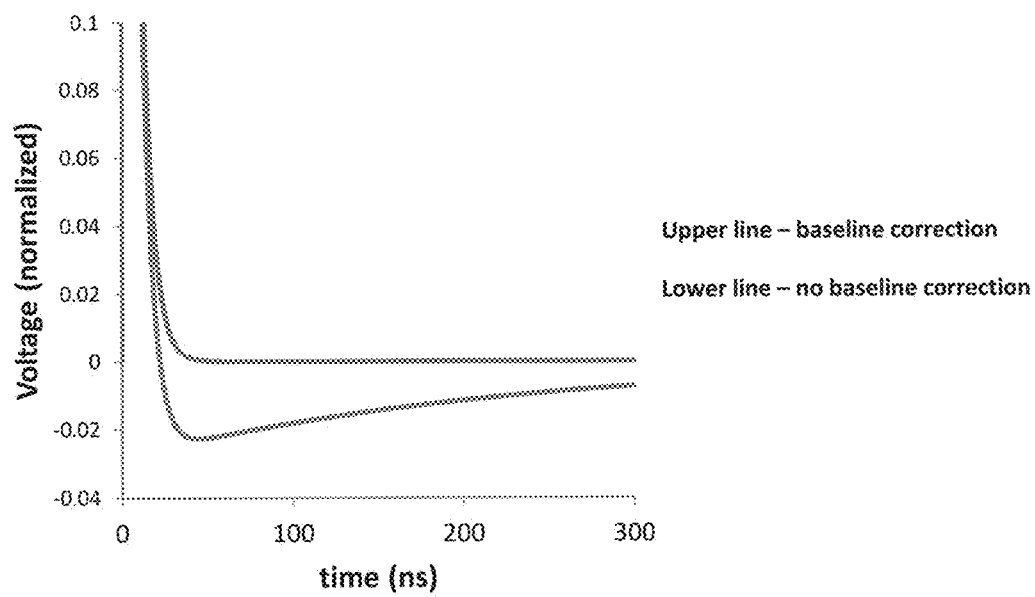
FIG. 8 is a simulated plot showing a comparison of output signals at a third electrode (fast terminal) of an SPM with and without a baseline correcting resistor with the voltage axis magnified.

FIG. 7 and FIG. 8 shows simulated outputs from the fast terminal 305 of FIG. 3 and the improved fast terminal design of FIG. 4. The output signal from electrode 305 of FIG. 3 is represented by the lower line in the graphs of FIGS. 7 and 8. The output signal from electrode 405 of FIG. 4 is represented by the upper lines in the graphs of FIGS. 7 and 8. The output signal from electrode 305 has no base line correction, while the output signal from electrode 405 has base line correction as a result of the resistive loads 440. The output loads which include a resistive load 440 in parallel with a capacitive load 420 have the effect of correcting the negative overshoot on the output response signal. As best illustrated in the graph of FIG. 8, the output signal from the electrode 305 has a negative overshoot as illustrated by the lower line in the graph, while the output signal from electrode 405 has no negative overshoot as illustrated by the upper line in the graph. The upper line of the graph does not go below zero while the lower line does. Thus, the resistive loads 440 have the effect of correcting negative overshoot. The optimal resistance value for the baseline correcting resistance $R_F$ in terms of the fast terminal capacitance $C_F$ and the microcell diode capacitance $C_D$ and the effective quench resistance $R'_Q$ is given by the following equation:

$$R_F = \frac{C_D}{C_F} R'_Q$$

Effective quench resistance $R'_Q = R_Q + N*R_S$
Where
N=Number of microcells in array
$R_S$=Series resistance to array, which includes additional resistance contributions arising from substrate bulk, metallization and contact interconnects to the terminals of the array.

For typical values of $C_D$=150 fF, $C_F$=6 fF, $R_Q$=300 kΩ, N=20000, $R_S$=3Ω results in an optimal value of $R_F$=9 MΩ. It is not intended to limit the present teaching to these exemplary values which are provided by way of example only.

In an exemplary simulation, it was found that by including a resistive load 440 having a resistance that is a multiple times the quench resistive load 417 corrects the overshoot on the output response signal on the electrode 405 and efficiently returns the output signal to its steady-state value. In one example, by setting the resistance of the resistive loads 440 in a range of between 90 to 100 times the resistance of the quench resistive elements 417 at least partially corrected the overshoot on the output signal. The range is provided by way of example, it is not intended to limit the present teaching to the exemplary range.

Figure 9:
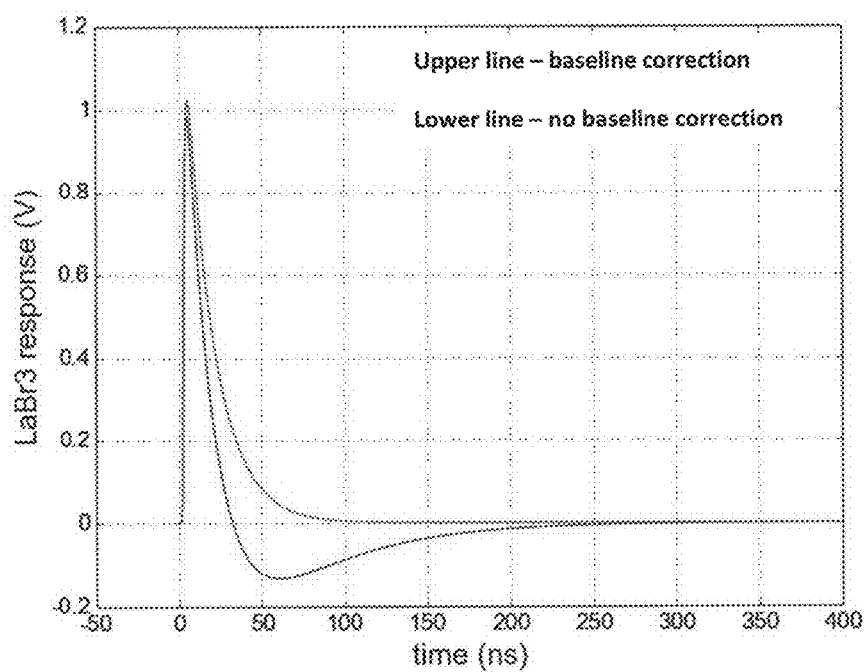
FIG. 9 is a simulated plot of output signals at a third electrode (fast terminal) of an SPM with and without a baseline correcting resistor in response to a LaBr3 scintillation crystal at 511 keV.

FIG. 9 shows an SPM response to a LaBr3 scintillation crystal at 511 keV. The output signal from electrode 305 of FIG. 3 is represented by the lower line in FIG. 9. The output signal from electrode 405 of FIG. 4 is represented by the upper line in the graph of FIG. 9. The output signal from electrode 305 has no base line corrective resistance loads 440, while the output signal from electrode 405 has base line corrective resistance loads. The output load which includes a resistive load 440 in parallel with a capacitive 420 has the effect of correcting the negative overshoot on the output response signal. The output signal from the electrode 305 has a negative overshoot as illustrated by the lower line in the graph, while the output signal from the electrode 405 has no negative overshoot as illustrated by the upper line in the graph. The upper line of the graph does not go below zero while the lower line does. Thus, the resistive loads 440 have the effect of correcting negative overshoot. Thus the signal from the electrode 405 correctly recovers the signal decay of the LaBr3 scintillation thereby overcoming the undesirable overshoot during microcell recovery. The output from the terminal 405 enhances the figure of merit (FOM) for neutron/gamma discrimination with a chosen scintillator to match currently achievable results with PMT and improve over current SiPM based solutions, while maintaining the best energy resolution (FWHM) possible. The FOM describes the clarity with which neutrons and gamma can be distinguished.

Figure 10:
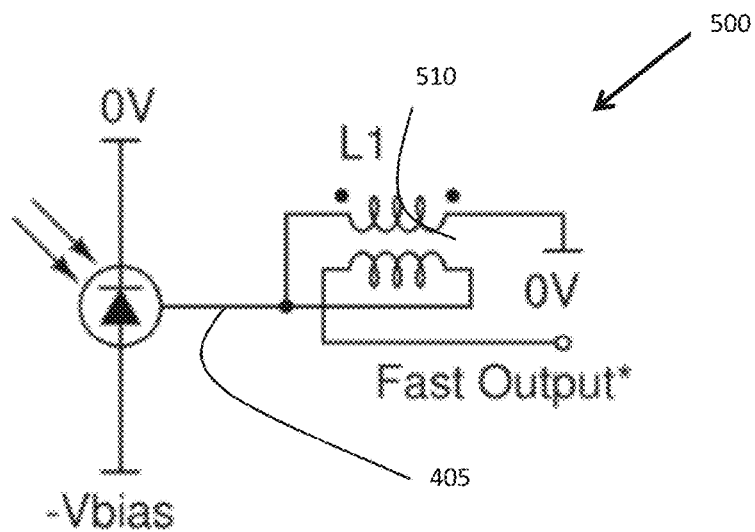
FIG. 10 is schematic diagram of a readout circuit.
Figure 11:
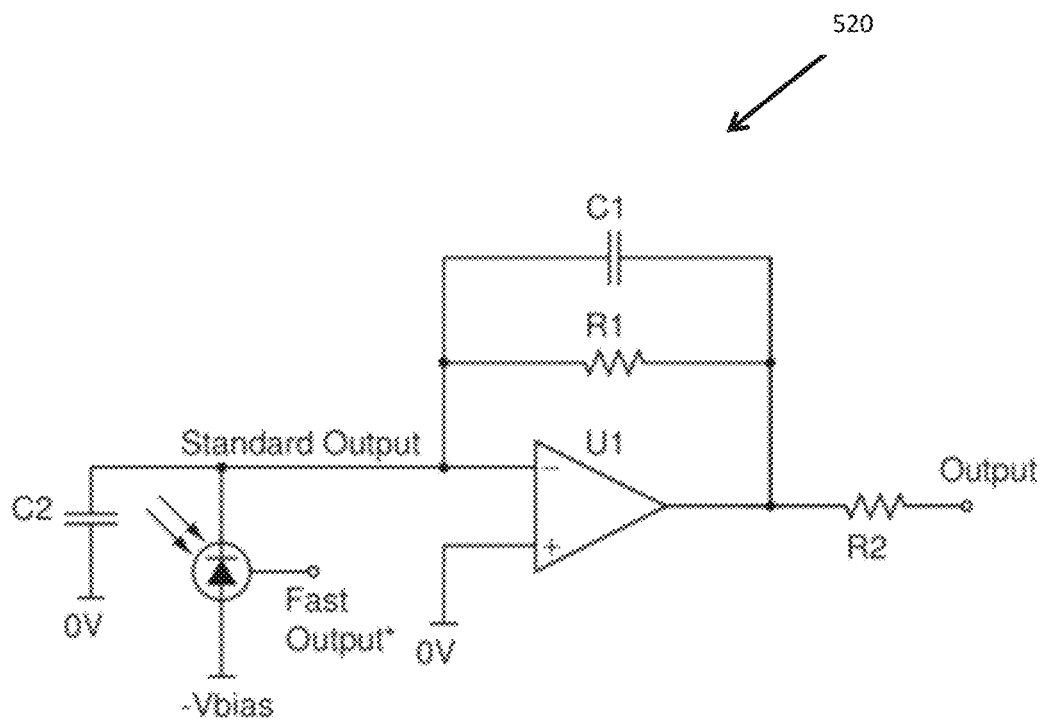
FIG. 11 is schematic diagram of a readout circuit.

FIG. 10 illustrates an exemplary implementation of a readout circuit 500 for the fast output terminal 405 of the SPM 400. The fast output signal from electrode 405 is passed through a Ruthroff transformer 510 which creates an impedance matched terminal to the output terminal. FIG. 11 illustrates a standard anode-cathode readout circuit 520 for the SPM 400A. In this configuration the fast output signal is floating and is not used in the readout of the signal; instead, a trans-impedance amplifier is used to convert the current signal at the cathode into voltage signal at the output.

Figure 12:
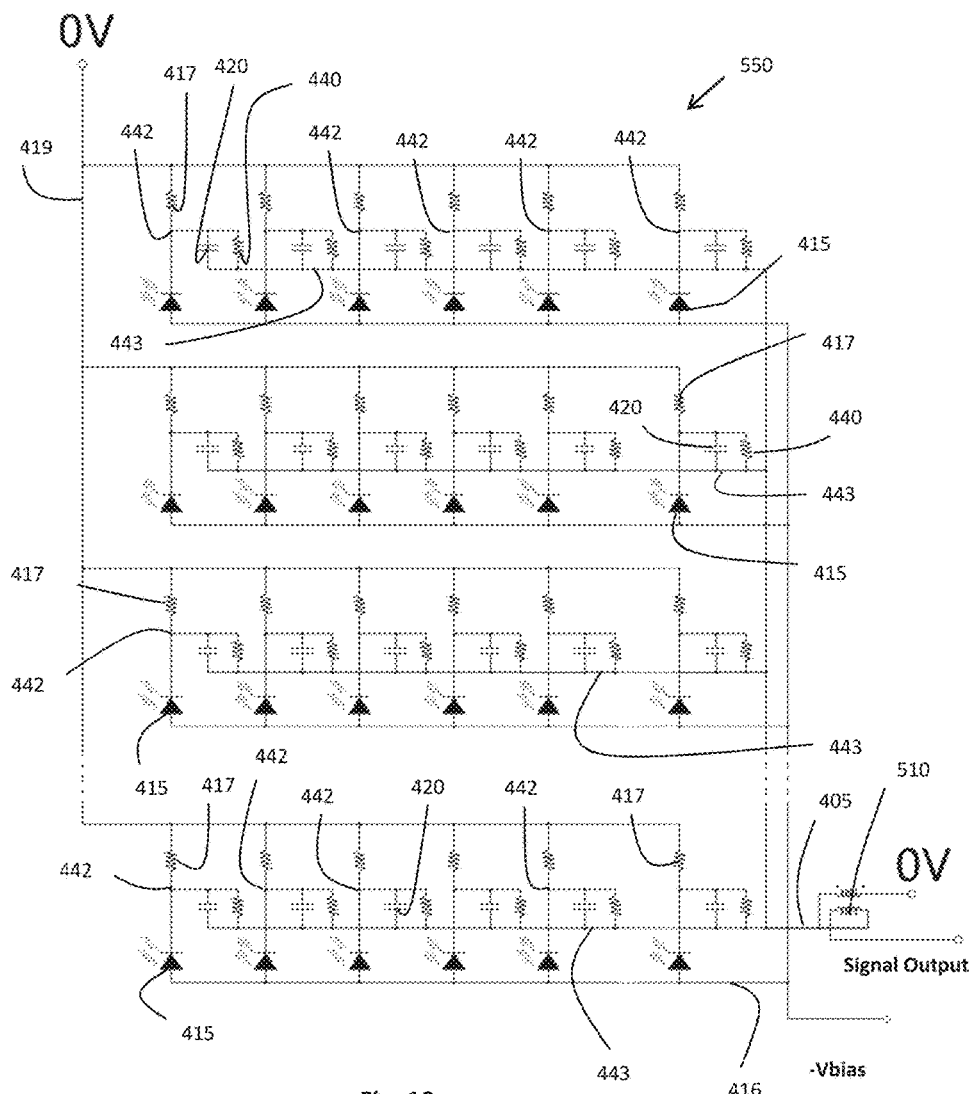
FIG. 12 shows a detector comprising a semiconductor photomultipier and a readout circuit.
Figure 13:
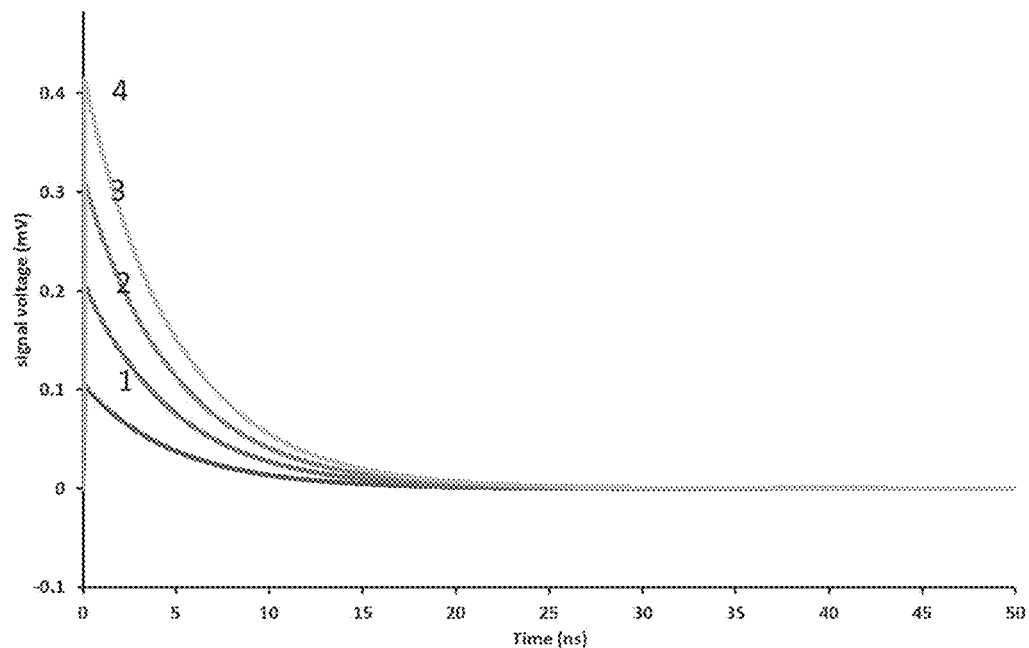
FIG. 13 illustrates the proportional signal response to the numbers of photons detected by a semiconductor photomultipier in accordance with the present teaching.

FIG. 12 shows an embodiment of a detector 550 which includes the SPM 400B and a readout circuit. The transformer's function is to impedance-match the fast output terminal 405 with a characteristic 50 ohm waveguide, such as a coaxial cable. FIG. 13 shows the simulated response to one, two, three and four microcells firing in the circuit, demonstrating the proportional signal response to the numbers of photons detected. Each curve in the plot shows a light-intensity proportional amplitude and charge (integrated current) response. The detector 550 comprises a plurality of avalanche diodes 415. A first electrode 416 is arranged to provide a bias voltage to the photosensitive elements 415. A second electrode 419 is arranged as a biasing electrode for the photosensitive elements 415. A plurality of quench resistive elements 417 are provided such that each quench resistive elements 417 is associated with a corresponding photosensitive element 417. A plurality of output loads each having a capacitive load 420 operably coupled to a resistive load 440 in a parallel configuration are provided between a first node 442 and a second node 443. Each first node 442 is common to one of the diodes 415 and the corresponding quench resistive element 417. A third electrode 405 is coupled to the second nodes 443 of the output loads to provide an output signal from the photosensitive elements 415. The readout circuit 510 is operable for communicating with the third electrode 405. The readout circuit 510 in the exemplary arrangement includes the Ruthroff transformer 510.

Figure 14:
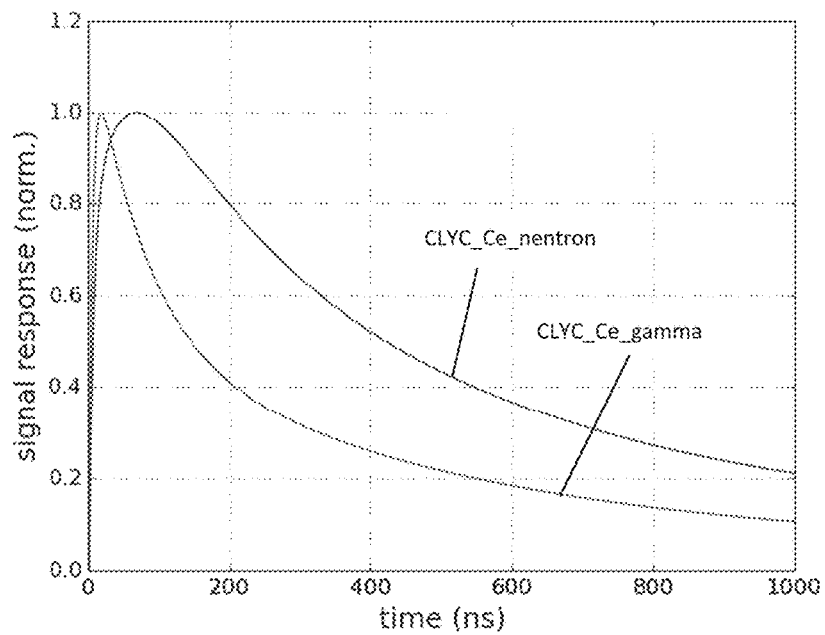
FIG. 14 shows the simulated response of a neutron and gamma event in a CLYC (Cs2LiYCl6:Ce) crystal detected by a semiconductor photomultiplier in accordance with the present teaching.

FIG. 14 shows the simulated response of a neutron and gamma event in a CLYC (Cs2LiYCl6:Ce) crystal. CLYC is a commercially available scintillating crystal that scintillates when gamma photons or neutrons penetrate the crystal. The detection scheme used to discriminate gamma and neutron events relies on the detectors ability to accurately reproduce the excitation decay. The modified fast terminal 405 response is well suited to resolving the decay differences— the table below demonstrates an improvement in the Figure-of-Merit (FOM) used to evaluate neutron-gamma discrimination. In a separate column, an experimental crystal CLLB (Cs2LiLaBr6:Ce), which has the advantages of higher yield but poorer neutron/gamma discrimination, is simulated to perform well with the modified fast terminal.

|  | CLYC | CLLB |
|---|---|---|
| Decay Time (ns) | $1^{CVL}$, 50, 1000 | 55, 270 |
| Light Yield (ph/MeV) | 20,000 | 60,000 |
| Light Yield (ph/n) | 70,000 | 180,000 |
| Resolution @662 keV | 3.9% | 2.9% |
| Gamma Equivalent Energy | 3.1 MeV | 3.2 MeV |
| PSD | Excellent | Possible |
| PMT FOM | 3.3 | 1.2 |
| SiPM Standard Terminal FOM (simulated) | 3.4 | 0.4 |

The detector 500 may reconstruct pulse shapes at time scales that are shorter than the recovery time for Pulse Shape Discrimination. The output of the third electrode 405 reproduces desirable characteristics of the signal from a traditional photomultiplier, which includes short rise time, short decay time, high signal-to-noise (low Noise Equivalent Power), high frequency, and low output capacitance. A pulse shape discrimination figure of merit (FOM) is used as a criteria for discriminating between neutron and gamma events. FOM uses two or more integration windows placed at different parts of the electrical signal response which are then used to construct a value that allows discrimination between neutron and gamma events.

Figure 15A:
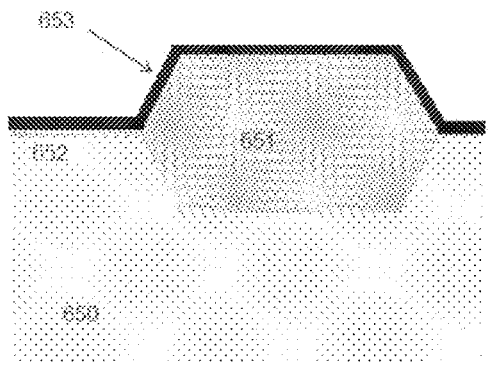
FIG. 15A-15G graphically illustrates a fabrication process for fabricating an SPM.
Figure 15B:
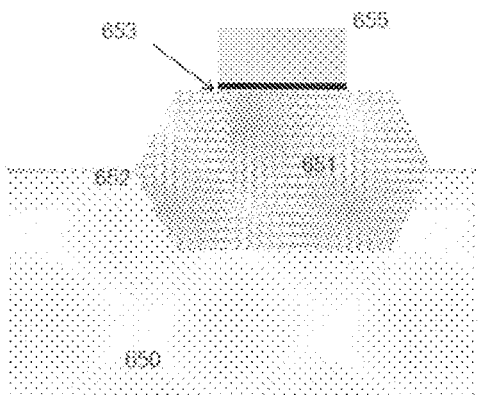
Figure 15C:
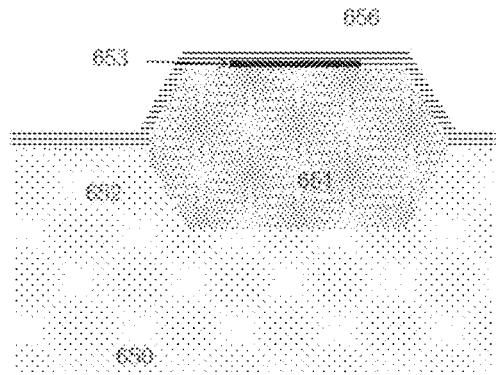
Figure 15D:
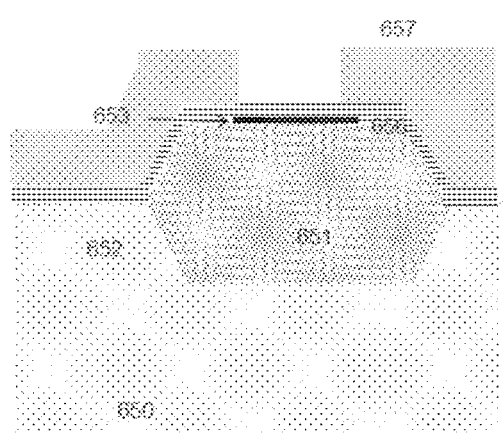
Figure 15E:
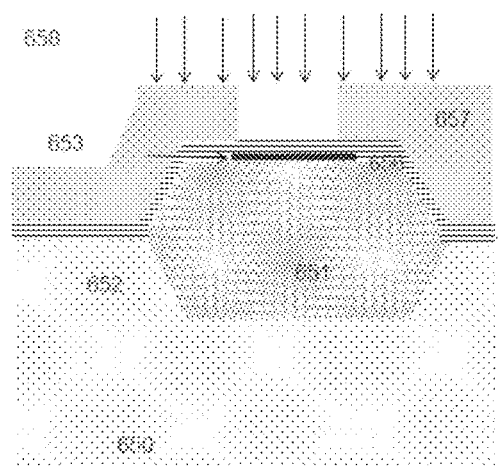
Figure 15F:
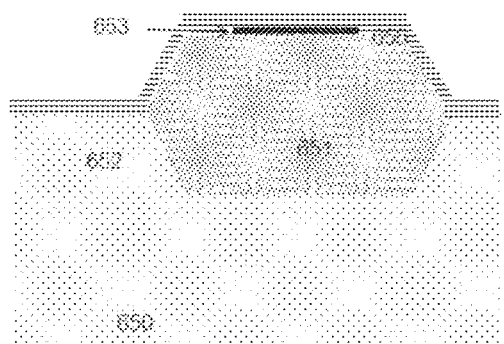
Figure 15G:
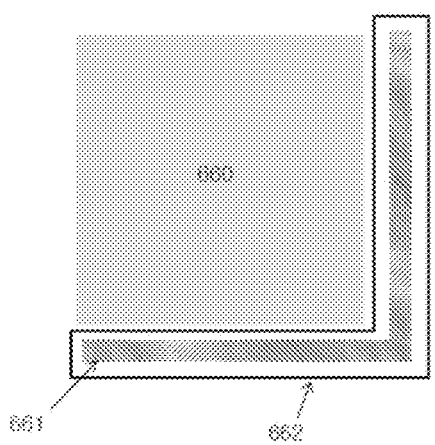
Figure 17:
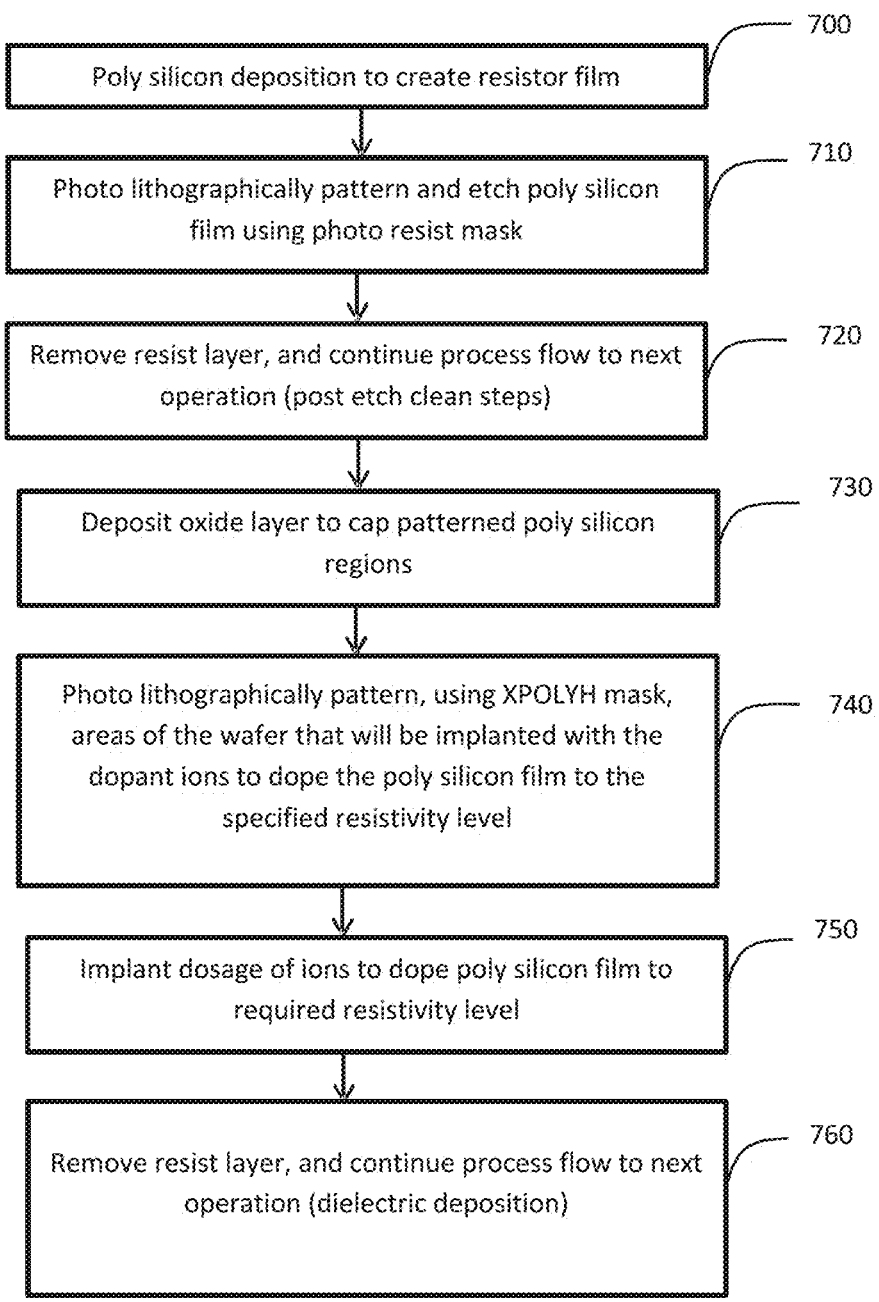
FIG. 17 is a flowchart representing the fabrication process of FIGS. 15A-15G.

FIG. 15A to FIG. 15G illustrates an exemplary fabrication process which is also in accordance with the present teaching. The flowchart of FIG. 17 details the exemplary fabrication steps. An isolating field oxide material such as SiO2 is provided on a substrate 650. An active layer 652 and a polysilicon film 653 are provided as illustrated in FIG. 15A. The polysilicon film 653 is deposited to create a resistor film as detailed in block 700. In block 710 a photo lithographically pattern is created on a photo resist mask 655 and the poly silicon film 653 is etched using photo resist mask 655 as illustrated in FIG. 15B. In block 720 the resist mask 655 is removed. In block 730 an oxide layer 656 is deposited to cap the region of the poly silicon film 653 that is patterned as illustrated in FIG. 15C. In block 730 a photoresist 675 is provided for a XPOLYH resist mask as illustrated in FIG. 15D. In block 730 the polysilicon film 653 is implanted with a dosage of ions 658 to make the polysilicon film 653 to have a predetermined resistivity level as illustrated in FIG. 15E. In block 740 the photoresist 675 is removed as illustrated in FIG. 15F. FIG. 15G illustrates an exemplary microcell which includes an active region 660, a polysilicon region 661 and a XPOLYH implant mask 662 as illustrated in FIG. 15G.

Figure 16A:
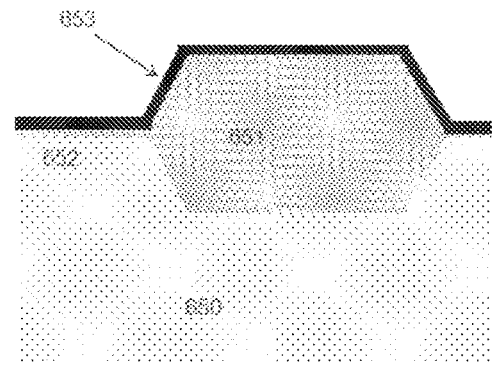
FIG. 16A-16H graphically illustrates a fabrication process for fabricating an SPM in accordance with the present teaching.
Figure 16B:
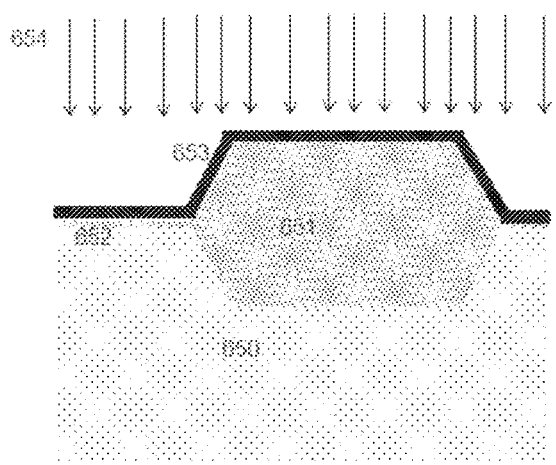
Figure 16C:
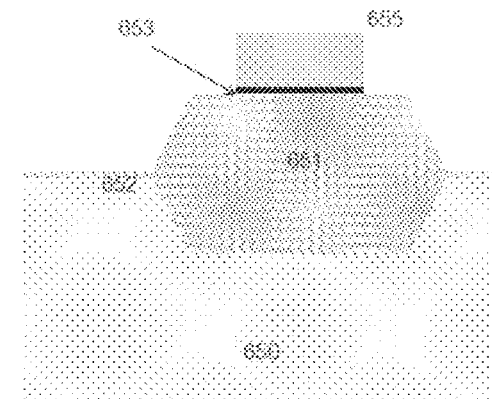
Figure 16D:
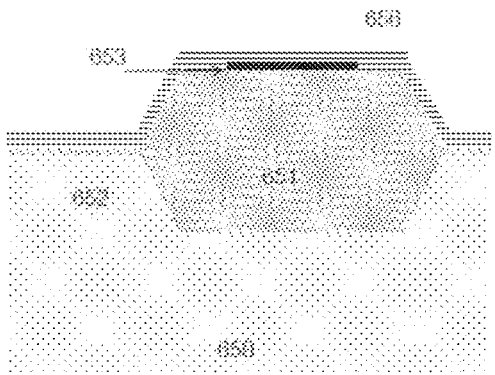
Figure 16E:
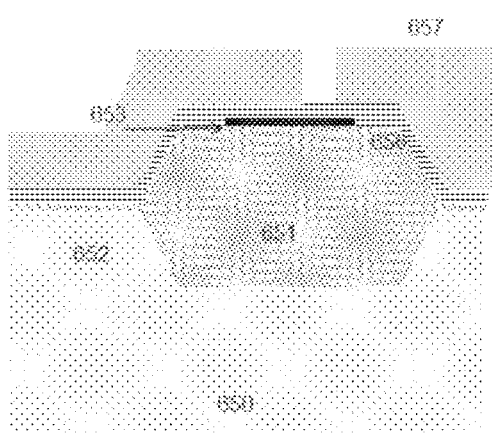
Figure 16F:
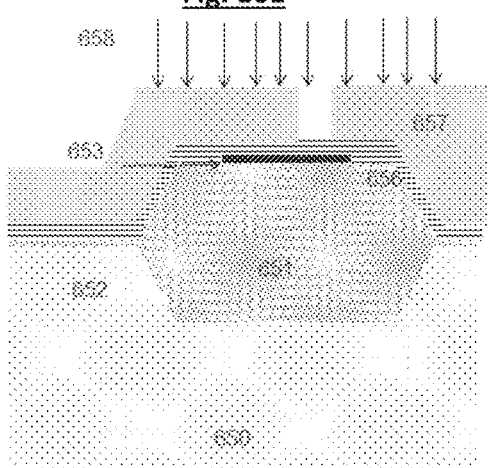
Figure 16G:
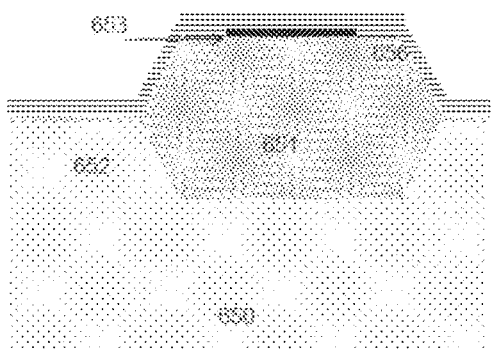
Figure 16H:
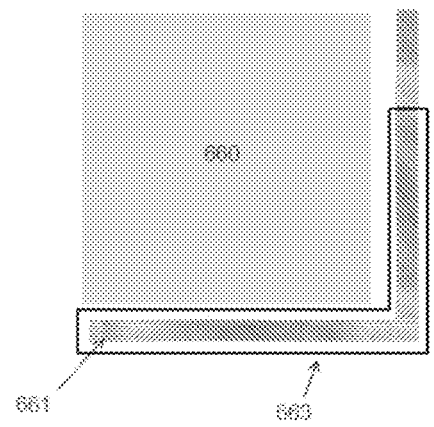
Figure 18:
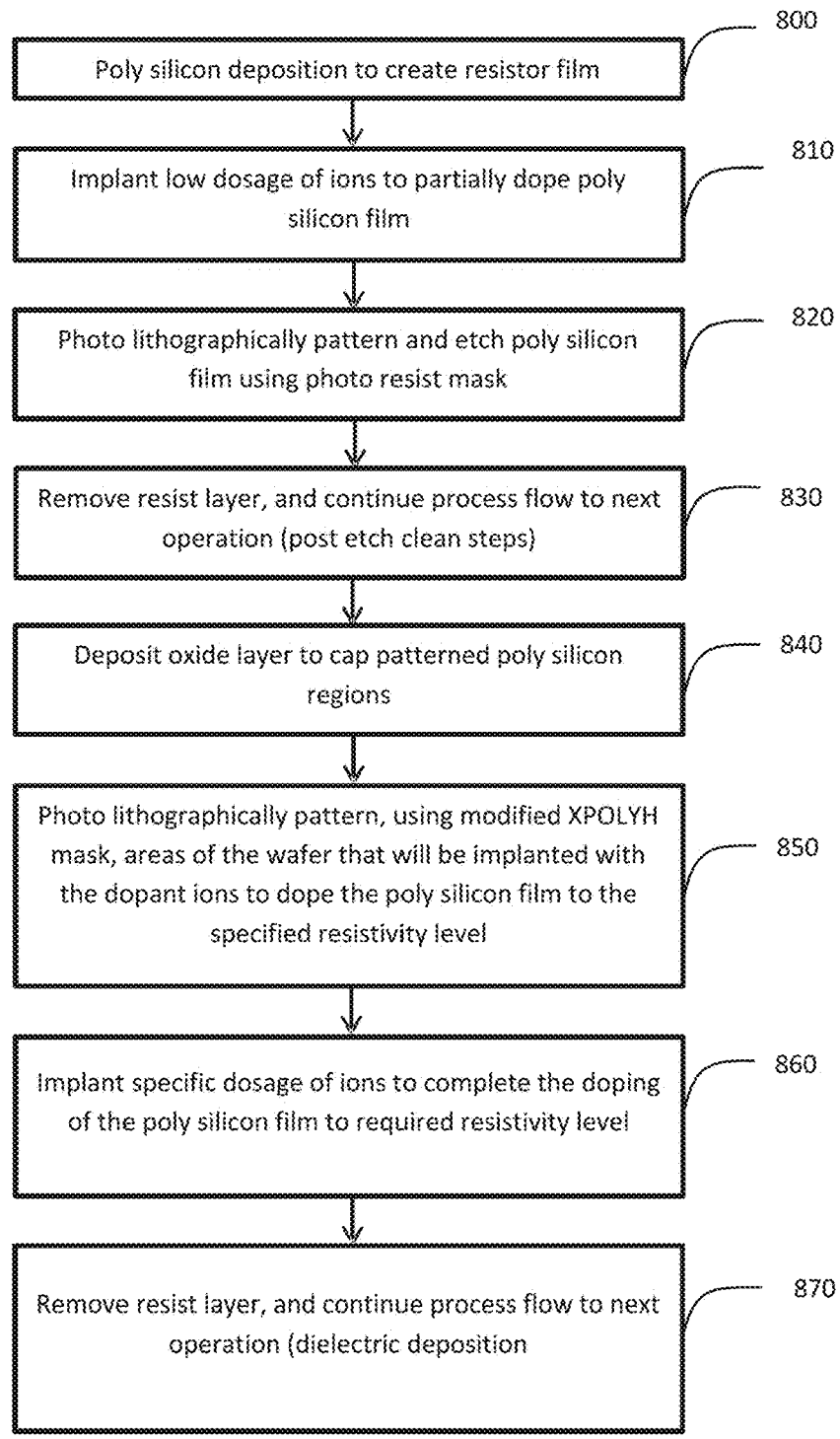
FIG. 18 is a flowchart representing the fabrication process of FIGS. 16A-16H.

FIG. 16A to FIG. 16H illustrates another exemplary fabrication process which is also in accordance with the present teaching. The flowchart of FIG. 18 details the exemplary fabrication steps. An isolating field oxide material such as SiO2 is provided on a substrate 650. An active layer 652 and a polysilicon film 653 are provided as illustrated in FIG. 16A. In block 800 a polysilicon film 653 is deposited to create a resistor film. In block 810 a low dosage of ions 654 is provided to partially dope the poly silicon film 653 as illustrated in FIG. 16B. In block 820 a photo lithographically pattern is created on a photo resist mask 655 and the poly silicon film 653 is etched using photo resist mask 655 as illustrated in FIG. 16C. In block 830 the resist mask 655 is removed. In block 840 an oxide layer 656 is deposited to cap the region of the poly silicon film 653 that is patterned as illustrated in FIG. 16D. In block 850 a photoresist 675 is provided for a XPOLYH resist mask as illustrated in FIG. 16E. The patterns are designed on the XPOLYH mask to exclude the dopant ions from the areas where low doped poly silicon regions are required for the SPM 400A. In block 860 the polysilicon film 653 is implanted with a dosage of ions 658 to make the polysilicon film 653 to have a predetermined resistivity level as illustrated in FIG. 16F. The dosage of dopant ions is delivered in two steps so that poly silicon regions of different resistivity as required for the SPM 400A can be created, and the location of these regions can be determined by the appropriate design of the XPOLYH mask 663. In block 870 the photoresist 675 is removed as illustrated in FIG. 16G. FIG. 16H illustrates an exemplary microcell which includes an active region 660, a polysilicon region 661 and a XPOLYH implant mask 663 as illustrated in FIG. 15G. This process allows the resistance of two poly regions on the same polysilicon layer to be controlled. This is achieved by masking the dose of the second implant on the resistive loads. The quench resistive elements receive both ion implant doses to adjust the low resistance of the quench resistive elements. The resistive loads 440 of the output loads will only receive one of the ion implant doses and hence its resistivity will be higher. In this way it will be appreciated by those of ordinary skill in the art that the quench resistive elements 417 and the resisitive loads 440 are formed on a single polysilicon layer which is patterned. The polysilicon layer has first regions of a first resistivity level and second regions of a second resistivity level. The first resistivity level is higher than the second resistivity level. The quench resistive elements 417 are formed in the second regions and the resistive loads 440 are formed in the first regions. By controlling the resistivity of the polysilicon layer allows low resistance regions to be formed for the quench elements 417 and high resistance regions to be formed for the resistors of the resistive loads 440 using a single polysilicon layer. If the polysilicon layer had uniform resistivity the area required for the resistive loads 440 would be larger and as a consequence the area of the active areas would need to be reduced. This inturn would reduce the sensitivity of the SPM 400A. The present inventors realised that the area of the active areas could be maximised by increasing the resistivity of polysilicon layer where the resistive loads 440 are formed. Thereby providing the required high resistance while minimising the area on the chip needed to accomodate the resistive loads 440. In an exemplary arrangement, the first regions and the second regions are positioned at least partially between two adjacent active areas to leave at least portions of the active areas available to detect light without obstruction from the quench resistive elements and the resistive loads. In an alternative arrangement, the first regions and the second regions are completely outside of the active areas to leave the entirety of the active areas available to detect light without obstruction from the quench resistive elements and the resistive loads.

Figure 19:
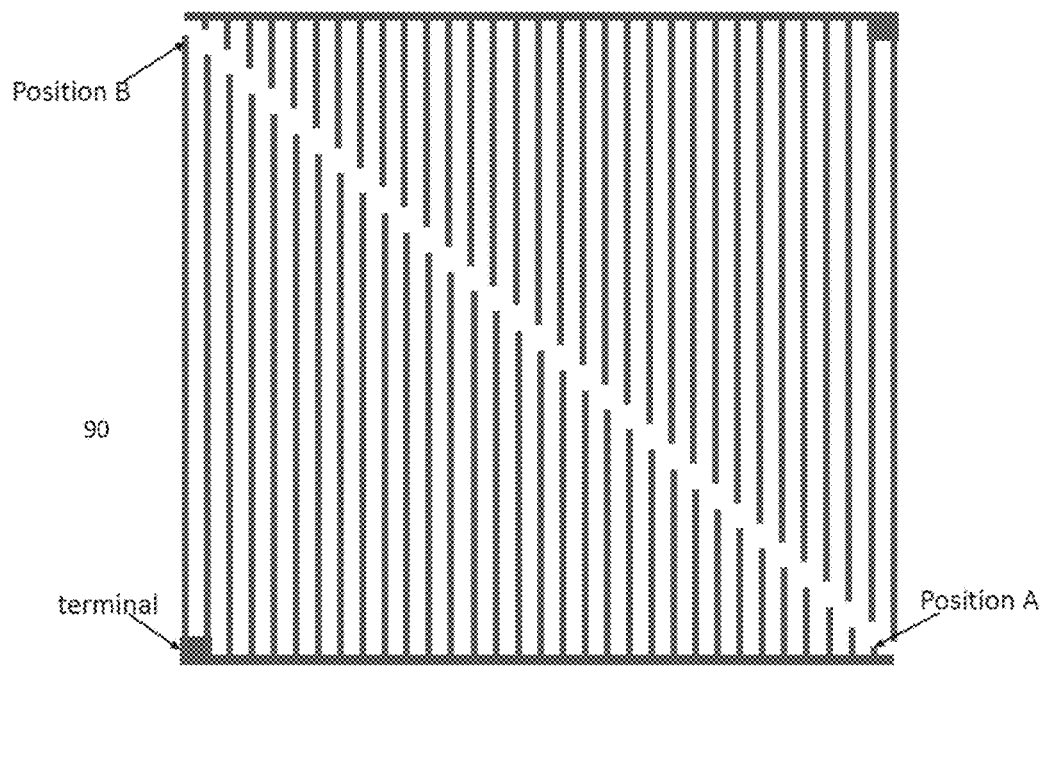
FIG. 19 is a graphical representation of signal paths from each microcell configured for reducing signal time delay variation.

Referring now to FIG. 19 there is illustrated an exemplary arrangement where the signal paths from the microcells to the terminals are equalised. For example, the signal path from position A to the terminal is approximately equal to signal path from position B. The signal path from each photosensitive element is configured to reduce signal time delay variations.

While the present teaching has been described with reference to exemplary arrangements and circuits it will be understood that it is not intended to limit the teaching of the present teaching to such arrangements as modifications can be made without departing from the spirit and scope of the present invention. In this way it will be understood that the present teaching is to be limited only insofar as is deemed necessary in the light of the appended claims.

Similarly the words comprises/comprising when used in the specification are used to specify the presence of stated features, integers, steps or components but do not preclude the presence or addition of one or more additional features, integers, steps, components or groups thereof.

What we claim is:

1. A semiconductor photomultiplier comprising:
a plurality of photosensitive elements,
a first electrode arranged to provide a bias voltage to the photosensitive elements,
a second electrode arranged as a biasing electrode for the photosensitive elements,
a plurality of quench resistive elements each associated with a corresponding photosensitive element,
a plurality of output loads having respective first and second nodes; each first node is common to one of the photosensitive elements and the corresponding quench resistive element; and
a third electrode provides an output signal from the photosensitive elements; the third electrode is coupled to the second node of the respective output loads; wherein the output loads fully or partially correct an overshoot of the output signal on the third electrode.

2. A semiconductor photomultiplier as claimed in claim 1, wherein the output signal on the third electrode is proportional to a number of photons detected.

3. A semiconductor photomultiplier as claimed in claim 1, wherein each output load comprises at least one of a resistive load element or a capacitive load element or a combination thereof.

4. A semiconductor photomultiplier as claimed in claim 3, wherein each resistive load element comprises a MOS transistor arranged in a resistor configuration.

5. A semiconductor photomultiplier as claimed in claim 4, wherein each capacitive load element is provided by gate-drain capacitance of the MOS transistor.

6. A semiconductor photomultiplier as claimed in claim 1, wherein the output loads fully or partially correct a negative overshoot of the output signal on the third electrode.

7. A semiconductor photomultiplier as claimed in claim 1, wherein the photosensitive elements are formed in active regions on a substrate.

8. A semiconductor photomultiplier as claimed in claim 3, wherein the quench resistive elements and the resistive load elements are formed on a single polysilicon layer which is patterned.

9. A semiconductor photomultiplier as claimed in claim 8, wherein the polysilicon layer has first regions of a first resistivity level and second regions of a second resistivity level.

10. A semiconductor photomultiplier as claimed in claim 9, wherein the first resistivity level is higher than the second resistivity level.

11. A semiconductor photomultiplier as claimed in claim 10, wherein the quench resistive elements are formed in the second regions and the resistive load elements are formed in the first regions.

12. A semiconductor photomultiplier as claimed in claim 11, wherein the first regions and the second regions are positioned at least partially between two adjacent active areas to leave at least portions of the active areas available to detect light without obstruction from the quench resistive elements and the resistive load elements.

13. A semiconductor photomultiplier as claimed in claim 11, wherein the first regions and the second regions are completely outside of the active areas to leave the entirety of the active areas available to detect light without obstruction from the quench resistive elements and the resistive load elements.

14. A semiconductor photomultiplier as claimed in claim 1, wherein each photosensitive element comprises a single photon avalanche diode (SPAD).

15. A semiconductor photomultiplier as claimed in claim 1, wherein the SPAD is a Geiger mode avalanche photodiode.

16. A semiconductor photomultiplier as claimed in claim 1, wherein the signal path from each photosensitive element is configured to reduce signal time delay variations.

17. A semiconductor photomultiplier as claimed in claim 3; wherein the optimal resistance value for the resistive load elements $R_F$ is provided by the following equation:

$$R_F = \frac{C_D}{C_F} R'_Q$$

Where:
$C_F$=fast terminal capacitance;
$C_D$=microcell diode capacitance;
$R'_Q$=effective quench resistance;
$R'_Q = R_Q + N*R_S$;
N=Number of microcells in array; and
$R_S$=Series resistance to array.

18. A semiconductor photomultiplier as claimed in claim 3, wherein each output load includes a current limiting diode in series with the resistive load element.

19. A semiconductor photomultiplier as claimed in claim 1, wherein each output load includes a current limiting diode in parallel with the resistive load element.

20. A detector comprising:
a plurality of photosensitive elements,
a first electrode arranged to provide a bias voltage to the photosensitive elements,
a second electrode arranged as a biasing electrode for the photosensitive elements,
a plurality of quench resistive elements each associated with a corresponding photosensitive element,
a plurality of output loads;
a first node of each output load is common to one of the photosensitive elements and the corresponding quench element;
a third electrode provides an output signal from the photosensitive elements, wherein the third electrode is coupled to a second node of the respective output loads, the output loads fully or partially correct an overshoot of the output signal on the third electrode; and
a readout circuit operable for communicating with the third electrode.

21. A detector as claimed in claim 20, wherein the readout circuit comprise a transformer for impedance matching the third electrode with a 50 ohm waveguide.

22. A detector as claimed in claim 21, wherein the transformer is a Ruthroff transformer.

23. A detector as claimed in claim 22, wherein the waveguide is a coaxial cable.

24. A detector as claimed in claim 22, wherein readout signals from the readout circuit are used for discriminating between neutron and gamma events.

25. A method of fabricating a photomultiplier as claimed in claim 1; the method comprising:
providing a plurality of photosensitive elements on a substrate,
providing a first electrode on the substrate which is arranged to provide a bias voltage to the photosensitive elements,
providing a second electrode on the substrate which is arranged as a biasing electrode for the photosensitive elements,
providing a plurality of quench resistive elements on the substrate such that each quench resistive element is associated with a corresponding photosensitive element,
providing a plurality of output loads on the substrate; a first node of each output node is common to one of the photosensitive elements and the corresponding quench element; and
providing a third electrode on the substrate which provides an output signal from the photosensitive elements; the third electrode is coupled to a second node of the respective output loads.

26. A method as claimed in claim 25, wherein the photosensitive elements are formed in active regions on the substrate.

27. A method as claimed in 25, wherein each output load includes a resistive load element, and the quench resistive elements and the resistive load elements are formed by patterning a single polysilicon layer.

28. A method as claimed in claim 27, wherein the polysilicon layer has first regions of a first resistivity level and second regions of a second resistivity level.

29. A method as claimed in claim 26, wherein the first resistivity level is higher than the second resistivity level.

30. A method as claimed in claim 29, wherein the quench resistive elements are formed in the second regions and the resistive load elements are formed in the first regions.

31. A method as claimed in claim 30, wherein the first regions and the second regions are positioned at least partially between two adjacent active areas to leave at least portions of the active areas available to detect light without obstruction from the quench resistive elements and the resistive load elements.

32. A method as claimed in claim 30, wherein the first regions and the second regions are completely outside of the active areas to leave the entirety of the active areas available to detect light without obstruction from the quench resistive elements and the resistive load elements.

33. A method as claimed in claim 28, wherein the first regions receive two separate ion implant dosages while the second regions receive a single ion implant dosage.

34. A method of discriminating between neutron and gamma scintillations events; the method comprising generating an output signal on the third electrode of the photomultiplier of claim 1 in response to gamma photons or neutrons penetrating a scintillating crystal.

35. A method as claimed in claim 34, wherein a detection scheme is used to discriminate gamma and neutron events using a detector operable to accurately reproduce excitation decay.

36. A method as claimed in claim 34, wherein pulse shapes are reconstructed at time scales shorter than the recovery time for Pulse Shape Discrimination; the output of the third electrode reproduces desirable characteristics of the signal from a traditional photomultiplier, which includes short rise time, short decay time, high signal-to-noise (low Noise Equivalent Power), high frequency, and low output capacitance.

37. A method as claimed in claim 36, wherein a pulse shape discrimination figure of merit (FOM) is used as a criterion for discriminating between neutron and gamma events, wherein the FOM uses two or more integration windows placed at different parts of the electrical signal response which are then used to construct a value that allows discrimination between neutron and gamma events.

* * * * *